(12) United States Patent
Gokita

(10) Patent No.: US 11,482,407 B2
(45) Date of Patent: Oct. 25, 2022

(54) WAFER GRINDING METHOD

(71) Applicant: DISCO CORPORATION, Tokyo (JP)

(72) Inventor: Yohei Gokita, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 217 days.

(21) Appl. No.: 17/010,991

(22) Filed: Sep. 3, 2020

(65) Prior Publication Data

US 2021/0074537 A1 Mar. 11, 2021

(30) Foreign Application Priority Data

Sep. 10, 2019 (JP) .............................. JP2019-164154

(51) Int. Cl.
  *H01L 21/02* (2006.01)
  *H01L 21/683* (2006.01)
  *B24B 41/06* (2012.01)
  *B24B 7/22* (2006.01)

(52) U.S. Cl.
  CPC ........ *H01L 21/02013* (2013.01); *B24B 7/228* (2013.01); *B24B 41/06* (2013.01); *H01L 21/6838* (2013.01)

(58) Field of Classification Search
  CPC .... H01L 21/02013; B24B 7/228; B24B 41/06
  USPC .......................................................... 451/54
  See application file for complete search history.

(56) References Cited

U.S. PATENT DOCUMENTS

2004/0097053 A1* 5/2004 Yajima .................... B24B 41/06
  438/459
2018/0200865 A1* 7/2018 Matsui .................... B24B 49/12

FOREIGN PATENT DOCUMENTS

JP 2003209080 A 7/2003
JP 2012134275 A * 7/2012
JP 2015205358 A 11/2015

* cited by examiner

Primary Examiner — Anne M Kozak
Assistant Examiner — Jonathan G Santiago Martinez
(74) Attorney, Agent, or Firm — Greer, Burns & Crain, Ltd.

(57) ABSTRACT

There is provided a wafer grinding method of grinding a wafer having an orientation flat for indicating a crystal orientation in the condition where the wafer is held on a holding surface of a chuck table. The chuck table includes a suction holding portion for holding the wafer under suction and a frame portion surrounding the suction holding portion. The suction holding portion has a first cutout portion corresponding to the orientation flat, and the frame portion has a second cutout portion formed along the first cutout portion. The wafer grinding method includes a holding surface grinding step of grinding the holding surface by using abrasive members of a grinding wheel, and a wafer grinding step of grinding the wafer by using the abrasive members in the condition where the wafer is held on the holding surface ground by the abrasive members.

3 Claims, 8 Drawing Sheets

WAFER GRINDING METHOD

BACKGROUND OF THE INVENTION

Field of the Invention

The present invention relates to a wafer grinding method for use in grinding a wafer having an orientation flat for indicating a crystal orientation.

Description of the Related Art

In a device chip fabrication process, a wafer having a plurality of devices such as integrated circuits (ICs) and large scale integrations (LSIs) is used, the respective devices being formed in a plurality of separate regions defined by a plurality of crossing division lines (streets). By dividing this wafer along the division lines, a plurality of device chips each including the device are obtained. These device chips are mounted in various kinds of electronic equipment such as mobile phones and personal computers. In recent years, it has been required to reduce the size and thickness of each device chip in association with a reduction in size and thickness of electronic equipment. To meet this requirement, a method of grinding the wafer is performed before dividing the wafer, thereby reducing the thickness of the wafer. By dividing the wafer after thinning the wafer, the device chips reduced in thickness can be obtained.

The wafer is ground by using a grinding apparatus including a chuck table for holding the wafer and a grinding unit for grinding the wafer. The grinding unit includes a grinding wheel having a plurality of abrasive members for grinding the wafer. In the condition where the wafer is held by the chuck table, both the chuck table and the grinding wheel are rotated and the abrasive members of the grinding wheel being rotated are brought into contact with the wafer held by the chuck table being rotated, thereby grinding the wafer to reduce the thickness of the wafer (see JP 2003-209080A and JP 2015-205358A, for example).

SUMMARY OF THE INVENTION

There is a case that an orientation flat for indicating a crystal orientation is formed on the wafer. The orientation flat is formed by linearly cutting out a part of the peripheral portion of the wafer, the part being in predetermined positional relation to the crystal orientation in the wafer. In processing the wafer, the orientation of the wafer is adjusted according to the position of the orientation flat.

It has been confirmed that when the wafer having the orientation flat is ground by a grinding apparatus, the grinding of the wafer is prone to proceed in an area (near area) near the orientation flat, so that the thickness of the wafer in this near area after grinding becomes smaller than that in the other areas. This phenomenon is estimated to be due to the fact that the contact area where the abrasive members come into contact with the wafer in grinding the near area of the wafer is smaller than that in grinding the other areas of the wafer, so that a load on the abrasive members in the near area is reduced and accordingly the wafer is more easily ground by the abrasive members in the near area than in the other areas. Accordingly, when the grinding apparatus is used to thin the wafer having the orientation flat, variations in thickness of the wafer ground occur unavoidably. Such variations in thickness of the wafer may cause a problem such that it is difficult to properly hold and process the wafer in a subsequent step. Further, there is also a possibility that the device chips obtained by dividing the wafer may have a dimensional error.

It is therefore an object of the present invention to provide a wafer grinding method which can reduce variations in thickness of a wafer having an orientation flat.

In accordance with an aspect of the present invention, there is provided a wafer grinding method of grinding a wafer having an orientation flat for indicating a crystal orientation in the condition where the wafer is held on a holding surface of a chuck table, the chuck table including a suction holding portion for holding the wafer under suction and a frame portion surrounding the suction holding portion, the suction holding portion having a first cutout portion corresponding to the orientation flat, the frame portion having a second cutout portion formed along the first cutout portion. The wafer grinding method includes a holding surface grinding step of grinding the holding surface by using abrasive members of a grinding wheel in the condition where the chuck table and the grinding wheel are rotated, the holding surface including an upper surface of the suction holding portion and an upper surface of the frame portion, a holding step of holding the wafer on the holding surface ground by the abrasive members in the holding surface grinding step in the condition where the position of the orientation flat coincides with the positions of the first cutout portion and the second cutout portion, and a wafer grinding step of grinding the wafer by using the abrasive members in the condition where the wafer is held on the holding surface ground by the abrasive members.

Preferably, the material of the suction holding portion and the frame portion is the same as the material of the wafer.

The wafer grinding method according to the present invention includes the holding surface grinding step of grinding the holding surface of the chuck table having the first cutout portion and the second cutout portion and the wafer grinding step of grinding the wafer having the orientation flat in the condition where the wafer is held on the holding surface ground in the holding surface grinding step. By using the wafer grinding method as mentioned above, the area near the orientation flat of the wafer is held by the area near the first cutout portion and the second cutout portion of the chuck table where a recessed portion is formed by performing the holding surface grinding step. Accordingly, local grinding of the wafer in the area near the orientation flat can be relaxed, so that variations in thickness of the wafer ground can be reduced.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
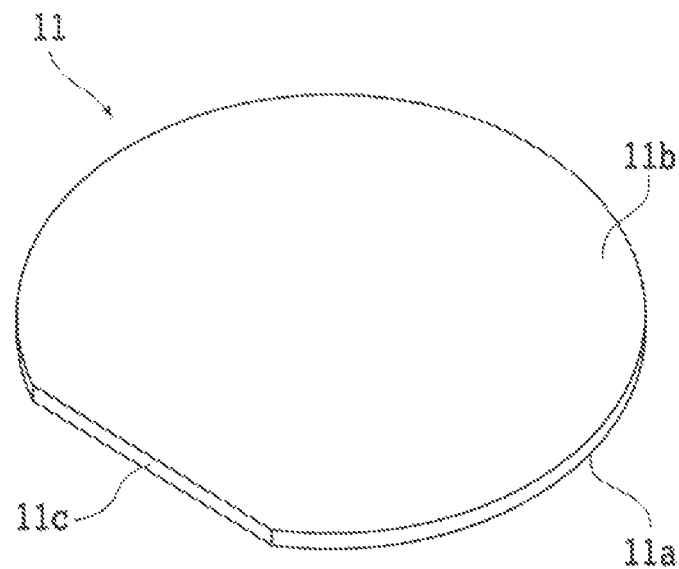
FIG. 1A is a perspective view depicting a wafer having an orientation flat.

A preferred embodiment of the present invention will now be described with reference to the attached drawings. There will first be described the configuration of a wafer 11 that can be processed by a wafer grinding method according to the preferred embodiment with reference to FIG. 1A. FIG. 1A is a perspective view of the wafer 11. For example, the wafer 11 is a disk-shaped silicon wafer. The wafer 11 has a front side (first surface) 11a and a back side (second surface) 11b. An orientation flat (cutout portion) 11c for indicating the crystal orientation in the wafer 11 is formed at a part of the peripheral portion of the wafer 11. The orientation flat 11c corresponds to a part of the peripheral edge (side surface) of the wafer 11, the part being linear in shape as viewed in plan. The orientation flat 11c is formed by linearly cutting out a part of the peripheral portion of the wafer 11, the part being in predetermined positional relation to the crystal orientation in the wafer 11. That is, the orientation flat 11c is formed at a predetermined position in correspondence with the crystal orientation in the wafer 11. Accordingly, by checking the position of the orientation flat 11c, the crystal orientation in the wafer 11 can be grasped. The wafer 11 is not limited in material, shape, structure, size, etc. For example, the wafer 11 may be formed of any semiconductors (e.g., GaAs, InP, GaN, and SiC) other than silicon. Further, the wafer 11 may be a substrate or the like formed of lithium tantalate or lithium niobate.

Although not depicted, a plurality of crossing division lines (streets) are formed on the front side 11a of the wafer 11 to thereby define a plurality of rectangular separate regions where a plurality of devices such as ICs, LSIs, and micro electro mechanical systems (MEMS) devices are respectively formed. That is, the plural devices are previously formed on the front side 11a of the wafer 11. By dividing the wafer 11 along the plural division lines, a plurality of chips (device chips) each including the device can be manufactured. Further, the devices formed on the wafer 11 are not limited in kind, number, shape, structure, size, layout, etc.

Figure 2:
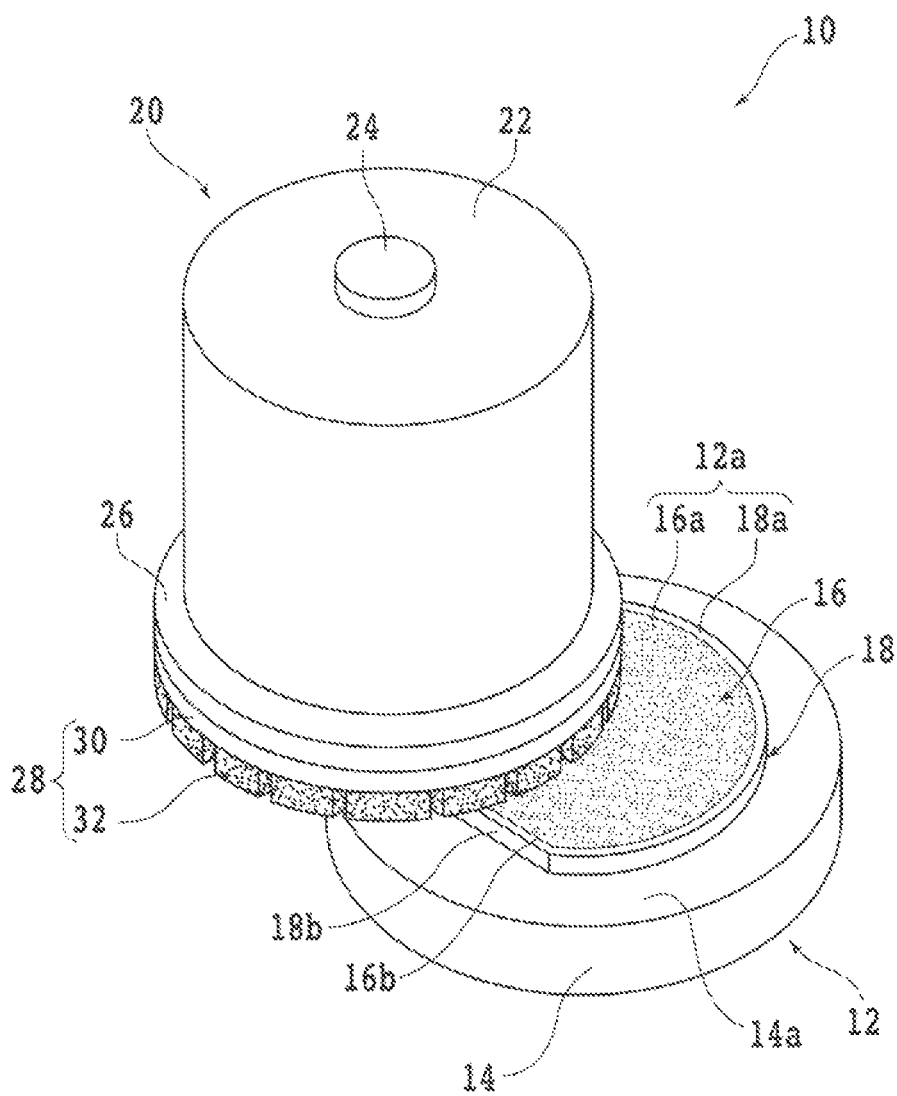
FIG. 2 is a perspective view depicting a grinding apparatus.

Prior to dividing the wafer 11, the wafer 11 is thinned for the purpose of thinning each chip. Such thinning of the wafer 11 is performed by grinding the back side 11b of the wafer 11 with abrasive members, for example. Such grinding of the wafer 11 is performed by using a grinding apparatus 10 depicted in FIG. 2. FIG. 2 is a perspective view of the grinding apparatus 10. The grinding apparatus 10 includes a chuck table (holding table) 12 for holding the wafer 11 and a grinding unit 20 for grinding the wafer 11 held by the chuck table 12.

Figure 3A:
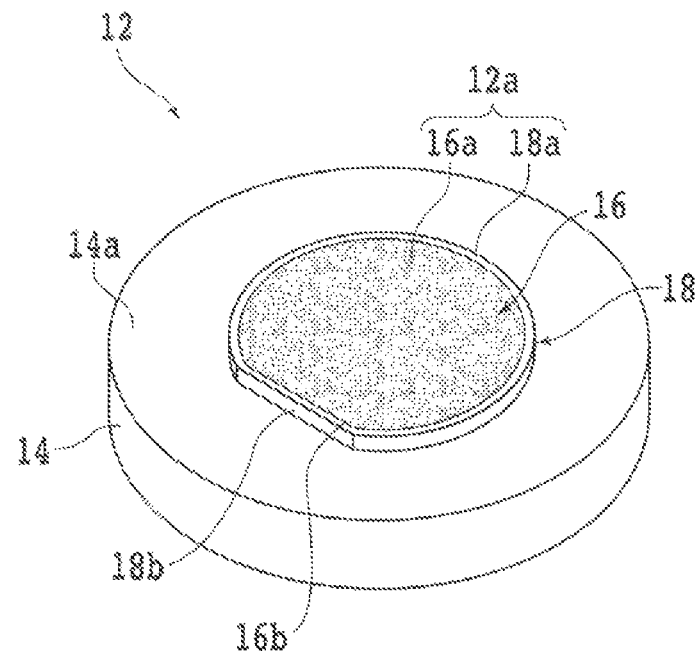
FIG. 3A is a perspective view depicting a chuck table included in the grinding apparatus depicted in FIG. 2.
Figure 3B:
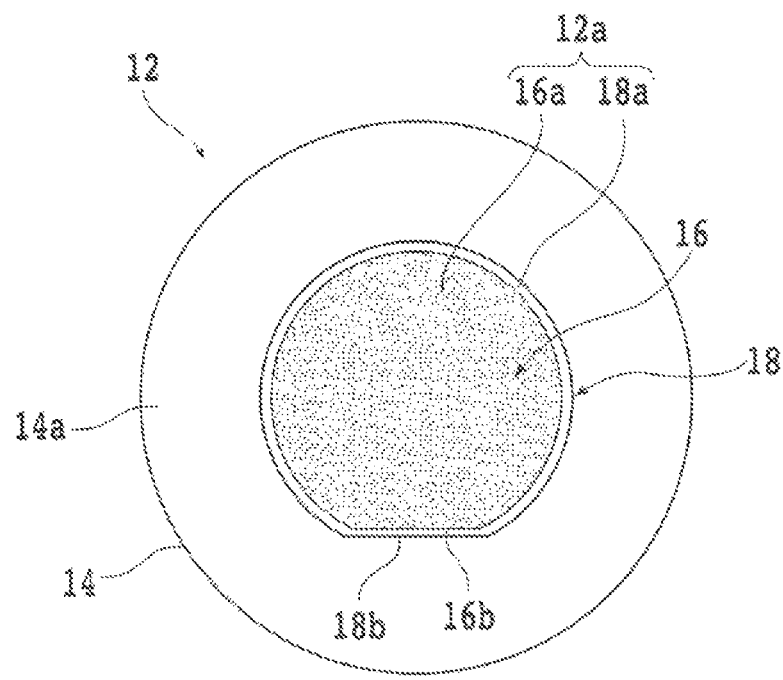
FIG. 3B is a plan view of the chuck table depicted in FIG. 3A.

FIG. 3A is a perspective view of the chuck table 12, and FIG. 3B is a plan view of the chuck table 12. The chuck table 12 includes a cylindrical base (body portion) 14 formed of metal, glass, ceramic, or resin, for example. As the metal, stainless steel (SUS) may be used. The base 14 has an upper surface 14a, and a plate-shaped suction holding portion 16 is provided on the upper surface 14a at its central portion so as to project upward from the upper surface 14a. The suction holding portion 16 is formed of a porous material such as porous ceramic. The suction holding portion 16 corresponds to a suction area for sucking the wafer 11 in holding the wafer 11 on the chuck table 12.

The suction holding portion 16 has a shape corresponding to the shape of the wafer 11. For example, the suction holding portion 16 has an upper surface 16a having substantially the same shape and size as those of the wafer 11 as viewed in plan. Further, a cutout portion (first cutout portion) 16b corresponding to the orientation flat 11c (see FIG. 1A) of the wafer 11 is formed at a part of the peripheral portion of the suction holding portion 16. The cutout portion 16b corresponds to a part of the peripheral edge (side surface) of the suction holding portion 16, the part being linear in shape as viewed in plan. For example, the cutout portion 16b has a length substantially equal to the length of the orientation flat 11c of the wafer 11.

An annular frame portion 18 is provided around the suction holding portion 16 so as to surround the side surface of the suction holding portion 16. The frame portion 18 is formed along the peripheral edge (side surface) of the suction holding portion 16 so as to project upward from the upper surface 14a of the base 14. The frame portion 18 has a height substantially equal to the height of the suction holding portion 16 as measured from the upper surface 14a of the base 14. That is, the frame portion 18 has an upper surface 18a, and the upper surface 18a is set in substantially the same level as that of the upper surface 16a of the suction holding portion 16. That is, the upper surface 18a of the frame portion 18 is flush with the upper surface 16a of the suction holding portion 16. The frame portion 18 may be formed integrally with the base 14 or may be formed separately from the base 14. In the latter case, the material of the frame portion 18 may be different from the material of the base 14. Examples of the material usable for the frame portion 18 are similar to those of the material of the base 14 as mentioned above.

The frame portion 18 is formed along the peripheral edge of the suction holding portion 16 so as to have a predetermined width. Accordingly, the frame portion 18 has a cutout portion (second cutout portion) 18b in an area adjacent to the cutout portion 16b of the suction holding portion 16, so that the cutout portion 18b of the frame portion 18 extends along the cutout portion 16b of the suction holding portion 16. For example, as depicted in FIG. 3B, the cutout portion 18b of the frame portion 18 is substantially parallel to the cutout portion 16b of the suction holding portion 16. The cutout portion 18b corresponds to a part of the peripheral edge (side surface) of the frame portion 18, the part being linear in shape as viewed in plan.

The upper surface 16a of the suction holding portion 16 and the upper surface 18a of the frame portion 18 constitute a holding surface 12a of the chuck table 12 for holding the wafer 11. That is, the wafer 11 is adapted to be held on the holding surface 12a including the upper surface 16a of the suction holding portion 16 and the upper surface 18a of the frame portion 18. The holding surface 12a is a flat surface formed in a horizontal plane. The holding surface 12a is connected through the porous suction holding portion 16 and a suction passage (not depicted) to a vacuum source (not depicted) such as an ejector for producing a vacuum, the suction passage being formed inside the base 14. In holding the wafer 11 by the chuck table 12, the wafer 11 is mounted on the holding surface 12a.

As a modification, the suction holding portion 16 may be formed of a nonporous material such as nonporous metal, glass, ceramic, and resin. In the case that the suction holding portion 16 is formed of such a nonporous material, a plurality of through holes are formed in the suction holding portion 16 so as to extend from the upper surface 16a of the suction holding portion 16 to the lower surface thereof. In this case, the holding surface 12a of the chuck table 12 is connected through these through holes to the vacuum source.

The chuck table 12 is connected to a rotational drive source (not depicted) such as a motor, so that the chuck table 12 can be rotated about its axis substantially parallel to a vertical direction by operating this rotational drive source. Further, the chuck table 12 is connected to a moving mechanism (not depicted), so that the chuck table 12 can be moved in a horizontal direction by operating this moving mechanism.

As depicted in FIG. 2, the grinding unit 20 is located above the chuck table 12. The grinding unit 20 includes a cylindrical housing 22 mounted on an elevating mechanism (not depicted), so that the housing 22 is vertically movable by this elevating mechanism. A cylindrical spindle 24 is rotatably supported in the housing 22. The spindle 24 extends in a vertical direction perpendicular to the holding surface 12a of the chuck table 12. That is, the spindle 24 has an axis substantially parallel to a vertical direction and is rotatable about this axis. A lower end portion (front end portion) of the spindle 24 projects from the lower end of the housing 22, and a disk-shaped mount 26 formed of metal or the like is fixed to the lower end of the spindle 24. A grinding wheel 28 is mounted on the lower surface of the mount 26. The grinding wheel 28 functions to grind the wafer 11 held by the chuck table 12.

The grinding wheel 28 includes an annular wheel base 30 formed of metal (e.g., stainless steel, aluminum) or resin, for example. The wheel base 30 has a diameter substantially equal to the diameter of the mount 26. The upper surface of the wheel base 30 is fixed to the lower end of the mount 26. The grinding wheel 28 further includes a plurality of abrasive members 32 fixed to the lower surface of the wheel base 30. Each abrasive member 32 has a shape like a rectangular prism. Each abrasive member 32 is formed by fixing abrasive grains with a bond. Examples of the abrasive grains include diamond and cubic boron nitride (cBN). Examples of the bond include a metal bond, a resin bond, and a vitrified bond. The plural abrasive members 32 are arranged at substantially equal intervals along the outer circumference of the wheel base 30. Each abrasive member 32 is not limited in material, shape, structure, size, etc. Further, the number of the abrasive members 32 fixed to the wheel base 30 can be set as desired.

A rotational drive source (not depicted) such as a motor is connected to the upper end (base end) of the spindle 24, so that the spindle 24 can be rotated about its axis by operating this rotational drive source. Accordingly, the grinding wheel 28 fixed to the mount 26 can be rotated about its axis coinciding with the axis of the spindle 24 by the torque transmitted from the rotational drive source through the spindle 24. Further, the grinding unit 20 is provided with a grinding fluid supply line (not depicted) for supplying a grinding fluid such as pure water.

In grinding the wafer 11 depicted in FIG. 1A by using the grinding apparatus 10, the wafer 11 is first held on the holding surface 12a of the chuck table 12. In the case of grinding the back side 11b of the wafer 11, the wafer 11 is held on the holding surface 12a of the chuck table 12 in the condition where the front side 11a of the wafer 11 is opposed to the holding surface 12a, and the back side 11b of the wafer 11 is exposed upward. Thereafter, the chuck table 12 holding the wafer 11 is moved to the position below the grinding unit 20. In this condition, both the chuck table 12 and the grinding wheel 28 are rotated and the grinding wheel 28 is lowered. When the abrasive members 32 come into contact with the back side 11b of the wafer 11, the back side 11b of the wafer 11 is ground by the abrasive members 32. Accordingly, the wafer 11 is ground to be thinned.

Figure 1B:
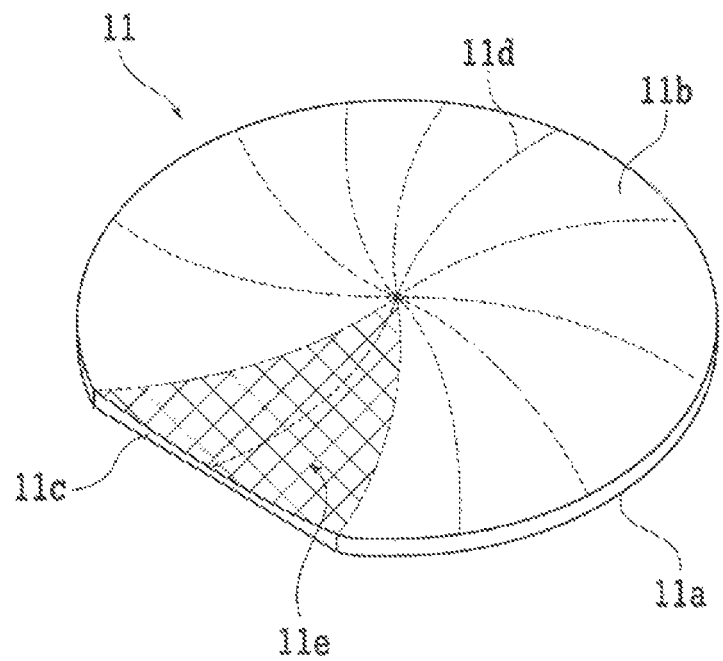
FIG. 1B is a perspective view of the wafer in the condition where the wafer has been ground by abrasive members.

FIG. 1B is a perspective view of the wafer 11 ground by the abrasive members 32. When the back side 11b of the wafer 11 is ground by the abrasive members 32, a saw mark 11d is formed on the back side 11b of the wafer 11 so as to radially extend from the center of the wafer 11 toward the peripheral edge thereof as depicted in FIG. 1B. The saw mark 11d is left so as to form curved lines along the path of movement of the abrasive members 32 of the grinding wheel 28 being rotated.

In the case that the holding surface 12a of the chuck table 12 is flat, variations in thickness of the wafer 11 are prone to occur in grinding the wafer 11 held on the holding surface 12a by using the abrasive members 32. More specifically, the grinding of the wafer 11 is prone to proceed in an area near the orientation flat 11c, so that the wafer 11 ground by the abrasive members 32 is prone to become thinner in this area near the orientation flat 11c than in the other areas of the wafer 11. In FIG. 1B, this area near the orientation flat 11c is patterned as a near area 11e. The near area 11e corresponds to an area defined between two lines connecting the center of the wafer 11 to the opposite ends of the orientation flat 11c as viewed in plan. In the near area 11e of the wafer 11, the distance from the center of the wafer 11 to the peripheral edge thereof is shorter than that in the other areas of the wafer 11. The orientation flat 11c is formed by removing a part of the peripheral portion of the wafer 11. Accordingly, in grinding the near area 11e of the wafer 11, the contact area where the abrasive members 32 come into contact with the wafer 11 becomes smaller than that in grinding the other areas of the wafer 11. As a result, a load on the abrasive members 32 in grinding the near area 11e of the wafer 11 is reduced, so that the wafer 11 is ground by the abrasive members 32 more easily in the near area 11e than in the other areas. That is, the grinding of the wafer 11 proceeds locally in the near area 11e, so that variations in amount of grinding of the wafer 11 occur. That is, variations in thickness of the wafer 11 ground occur.

In the wafer grinding method according to the preferred embodiment for solving the above problem, the holding surface 12a of the chuck table 12 having the cutout portions 16b and 18b (see FIG. 2) corresponding to the orientation flat 11c is ground by the abrasive members 32 to thereby modify the shape of the holding surface 12a. By performing such grinding of the holding surface 12a, an area near the cutout portions 16b and 18b of the chuck table 12 is preferentially ground to thereby produce variations in vertical position on the holding surface 12a. Thereafter, the wafer 11 is held on the holding surface 12a ground by the abrasive members 32, and the wafer 11 is next ground by the abrasive members 32. At this time, the wafer 11 is held on the holding surface 12a in such a manner that the area 11e near the orientation flat 11c is curved (recessed) due to the variations in vertical position on the holding surface 12a, so that the near area 11e is less easily ground than the other areas. Accordingly, variations in amount of grinding of the wafer 11 can be relaxed, so that variations in thickness of the wafer 11 can be reduced.

The wafer grinding method according to the preferred embodiment will now be described more specifically. First, the holding surface 12a of the chuck table 12 is ground by the abrasive members 32 (holding surface grinding step). In the holding surface grinding step, the chuck table 12 is positioned such that the suction holding portion 16 and the frame portion 18 are overlapped with the abrasive members 32 as depicted in FIG. 2. For example, the position of the chuck table 12 in a horizontal direction is adjusted such that the axis of rotation (center) of the chuck table 12 lies on the path of movement of the abrasive members 32 in rotating the grinding wheel 28 as viewed in plan.

Thereafter, the chuck table 12 is rotated at a predetermined speed in a predetermined direction, and the grinding wheel 28 is also rotated at a predetermined speed in a predetermined direction. Thereafter, the grinding wheel 28 is lowered toward the chuck table 12. At this time, the plural abrasive members 32 are moved so as to pass through the axis of rotation of the chuck table 12 as viewed in plan. Further, the lowering speed of the grinding wheel 28 is adjusted such that the plural abrasive members 32 are pressed on the holding surface 12a of the chuck table 12 by a suitable force. When the grinding wheel 28 is lowered to bring the lower surfaces of the plural abrasive members 32 into contact with the holding surface 12a of the chuck table 12, the holding surface 12a is ground by the abrasive members 32. Accordingly, the shape of the holding surface 12a is modified. During the grinding of the holding surface 12a, a grinding fluid such as pure water is supplied to the holding surface 12a and the plural abrasive members 32. By supplying the grinding fluid, the holding surface 12a and the plural abrasive members 32 are cooled, and dust (grinding dust) generated by the grinding of the holding surface 12a is washed away.

Figure 4A:
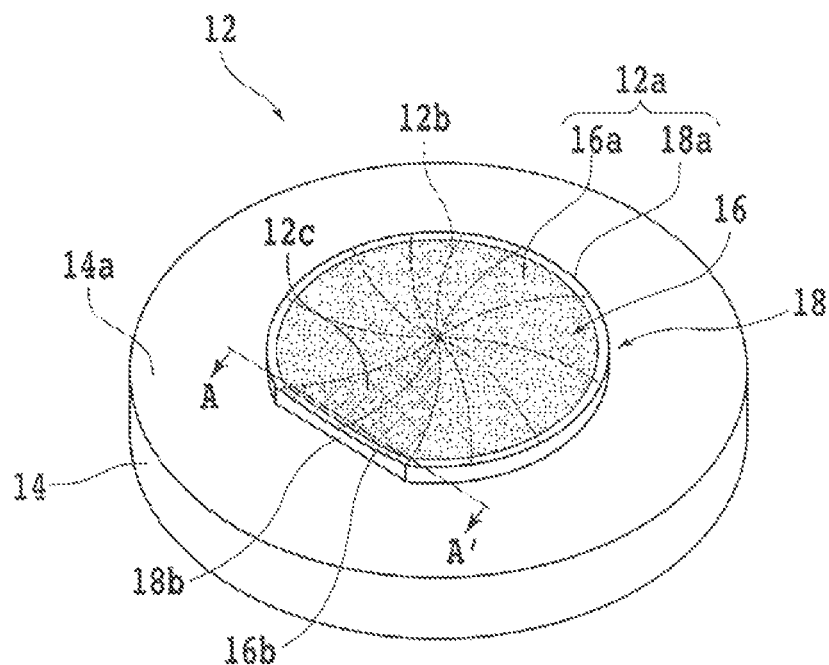
FIG. 4A is a perspective view of the chuck table in the condition where a holding surface grinding step of grinding a holding surface of the chuck table has been performed.
Figure 4B:
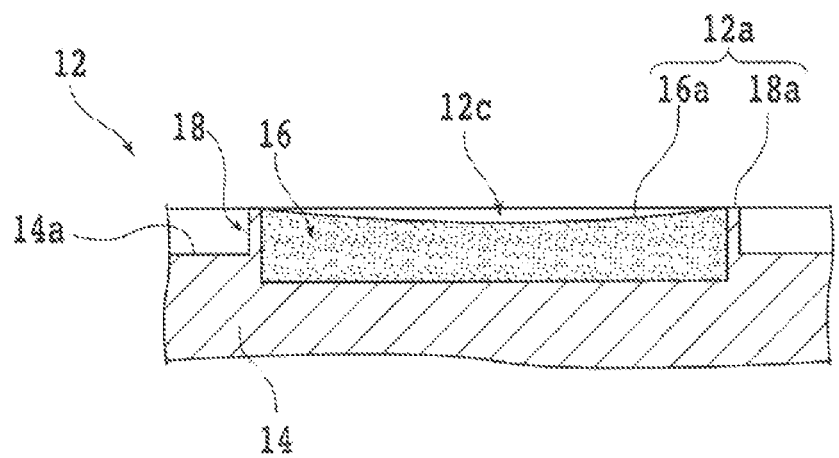
FIG. 4B is an enlarged sectional view of an essential part of the chuck table depicted in FIG. 4A.

FIG. 4A is a perspective view of the chuck table 12 in the condition where the holding surface grinding step has been performed, and FIG. 4B is an enlarged sectional view depicting an essential part of the chuck table 12 depicted in FIG. 4A. More specifically, FIG. 4B is an enlarged cross section taken along the line A-A' in FIG. 4A. When the holding surface 12a of the chuck table 12 is ground by the abrasive members 32, a saw mark 12b is formed on the holding surface 12a of the chuck table 12 so as to radially extend from the center of the holding surface 12a toward the peripheral edge thereof as depicted in FIG. 4A. The saw mark 12b is left so as to form curved lines along the path of movement of the abrasive members 32 of the grinding wheel 28 being rotated.

As mentioned above, the suction holding portion 16 and the frame portion 18 have the cutout portion 16b and the cutout portion 18b, respectively, which correspond to the orientation flat 11c of the wafer 11 (see FIG. 1A). In FIG. 4A, a reference sign 12c denotes an area near the cutout portions 16b and 18b of the suction holding portion 16 and the frame portion 18, and the area 12c is patterned as a near area. The near area 12c corresponds to an area defined between two lines connecting the center of the holding surface 12a to the opposite ends of the cutout portion 18b of the frame portion 18 as viewed in plan. In the near area 12c, the distance from the center of the suction holding portion 16 (i.e., the center of the holding surface 12a) to the peripheral edge of the frame portion 18 (i.e., the peripheral edge of the holding surface 12a) is shorter than that in the other areas of the holding surface 12a.

In grinding the near area 12c of the suction holding portion 16 and the frame portion 18, the contact area where the abrasive members 32 come into contact with the holding surface 12a becomes smaller than that in grinding the other areas of the chuck table 12. As a result, a load on the abrasive members 32 in grinding the near area 12c is reduced, so that the holding surface 12a is ground by the abrasive members 32 more easily in the near area 12c than in the other areas. That is, the grinding of the holding surface 12a proceeds locally in the near area 12c, so that variations in vertical position on the holding surface 12a occur. More specifically, in the condition after grinding the holding surface 12a, the thickness of the chuck table 12 in the near area 12c of the suction holding portion 16 and the frame portion 18 is smaller than that in the other areas. That is, the upper surface of the near area 12c of the chuck table 12 is ground to be curved (recessed) between one end of the near area 12c and the other end thereof as depicted in FIG. 4B (i.e., between the opposite ends of the near area 12c as viewed in FIG. 4B). That is, the holding surface 12a is recessed in the near area 12c only by the holding surface grinding step.

Figure 5A:
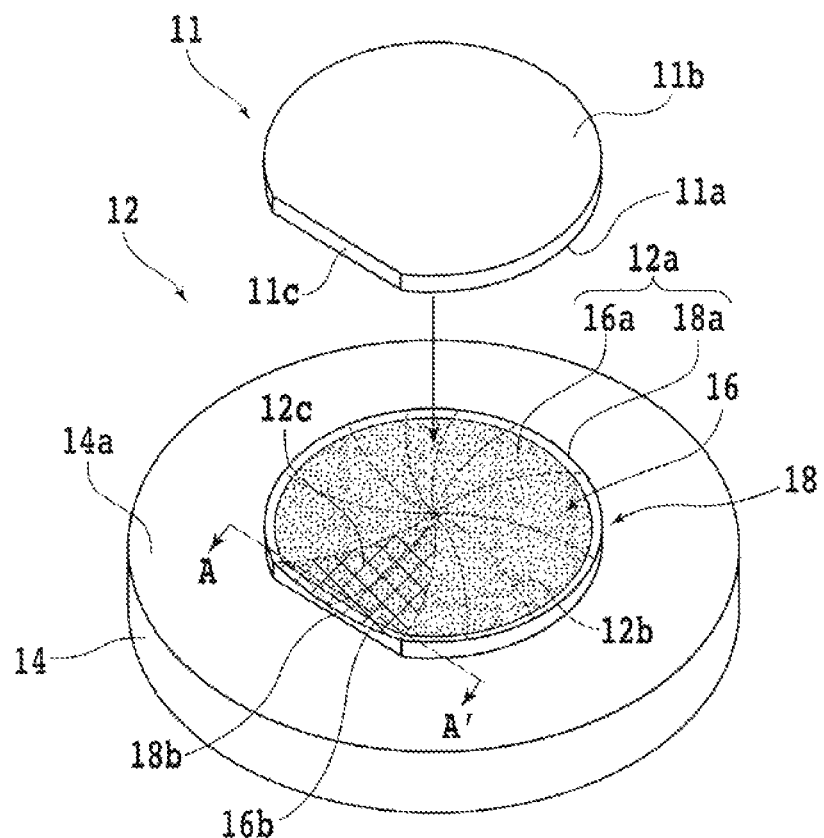
FIG. 5A is a perspective view depicting a holding step of holding the wafer on the holding surface ground by the abrasive members in the holding surface grinding step.

After performing the holding surface grinding step, the wafer 11 is held on the holding surface 12a ground by the abrasive members 32 (holding step). FIG. 5A is a perspective view depicting a manner of holding the wafer 11 on the holding surface 12a of the chuck table 12 in the holding step. In the holding step, the wafer 11 is first placed on the holding surface 12a of the chuck table 12 in the condition where the surface to be ground by the abrasive members 32 is exposed upward. For example, as depicted in FIG. 5A, the wafer 11 is placed on the holding surface 12a of the chuck table 12 in the condition where the front side 11a is opposed to the holding surface 12a and the back side 11b is exposed upward. At this time, the wafer 11 is placed so as to cover the whole of the upper surface 16a of the suction holding portion 16.

Further, in the holding step, the wafer 11 is placed on the holding surface 12a in the condition where the position of the orientation flat 11c coincides with the position of the cutout portions 16b and 18b of the suction holding portion 16 and the frame portion 18. More specifically, the area 11e near the orientation flat 11c of the wafer 11 is superimposed on the area 12c near the cutout portions 16b and 18b, i.e., the near area 12c of the chuck table 12. Further, the wafer 11 is placed such that the longitudinal direction of the orientation flat 11c is substantially parallel to the longitudinal direction of the cutout portions 16b and 18b. In this condition, the vacuum source connected to the suction holding portion 16 is operated to apply a vacuum to the holding surface 12a, so that the wafer 11 is sucked to the suction holding portion 16 and held under suction on the holding surface 12a of the chuck table 12. As a modification, a protective member may be attached to the front side 11a of the wafer 11 so as to protect the devices formed on the front side 11a. As the protective member, a protective tape formed of flexible plastic or the like may be used. In this case, the wafer 11 is held through the protective member on the holding surface 12a of the chuck table 12.

Figure 5B:
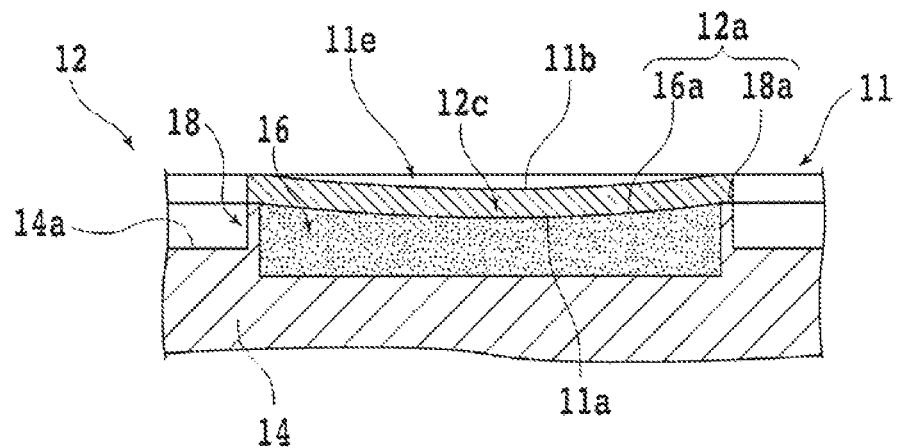
FIG. 5B is an enlarged sectional view of an essential part of the wafer held on the holding surface of the chuck table in the condition where the holding step has been performed.

FIG. 5B is an enlarged sectional view of an essential part of the wafer 11 held under suction on the holding surface 12a of the chuck table 12. As depicted in FIG. 5B, the thickness of the suction holding portion 16 in the near area 12c is smaller than that in the other areas. Accordingly, when the wafer 11 is held under suction on the holding surface 12a, the wafer 11 is partially curved according to the modified shape of the holding surface 12a. More specifically, the front side 11a of the wafer 11 in the near area 11e superimposed on the near area 12c of the chuck table 12 comes into close contact with the holding surface 12a. That is, the near area 11e of the wafer 11 is curved (recessed) downward so as to be fitted to the recessed upper surface of the near area 12c of the chuck table 12 as depicted in FIG. 5B.

Figure 6:
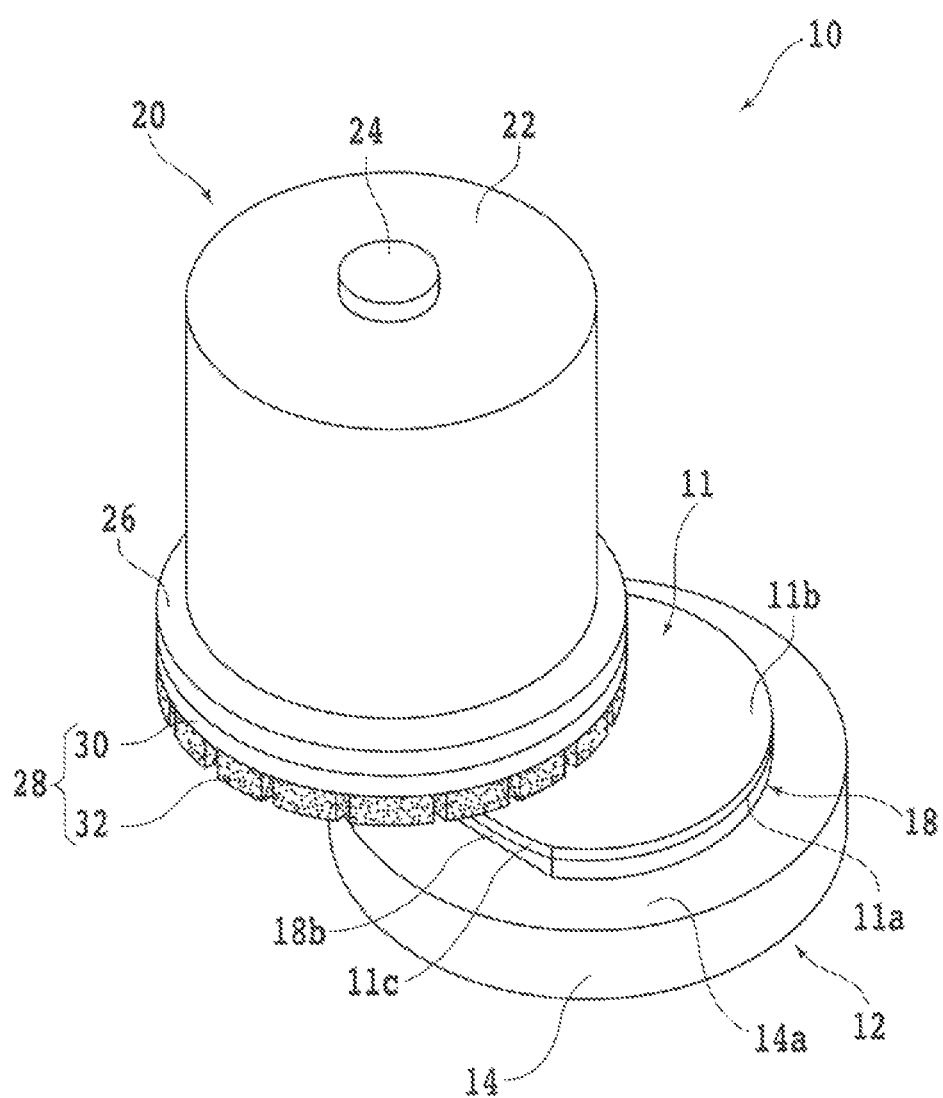
FIG. 6 is a perspective view depicting a wafer grinding step of grinding the wafer held on the holding surface ground.

After performing the holding step, the wafer 11 held on the holding surface 12a of the chuck table 12 is ground by the abrasive members 32 (wafer grinding step). FIG. 6 is a perspective view depicting the wafer grinding step using the grinding apparatus 10. In the wafer grinding step, the chuck table 12 is positioned such that the wafer 11 is overlapped with the abrasive members 32. For example, the position of the chuck table 12 in a horizontal direction is adjusted such that the axis of rotation of the chuck table 12 (the center of the wafer 11) lies on the path of movement of the abrasive members 32 in rotating the grinding wheel 28 as viewed in plan.

Thereafter, the chuck table 12 is rotated at a predetermined speed in a predetermined direction, and the grinding wheel 28 is also rotated at a predetermined speed in a predetermined direction. Thereafter, the grinding wheel 28 is lowered toward the chuck table 12. At this time, the plural abrasive members 32 are moved so as to pass through the axis of rotation of the chuck table 12 (the center of the wafer 11) as viewed in plan. Further, the lowering speed of the grinding wheel 28 is adjusted such that the plural abrasive members 32 are pressed on the back side 11b of the wafer 11 by a suitable force. When the grinding wheel 28 is lowered to bring the lower surfaces of the plural abrasive members 32 into contact with the back side 11b of the wafer 11, the back side 11b of the wafer 11 is ground by the abrasive members 32. Accordingly, the wafer 11 is thinned. During the grinding of the wafer 11, a grinding fluid such as pure water is supplied to the wafer 11 and the plural abrasive members 32. By supplying the grinding fluid, the wafer 11 and the plural abrasive members 32 are cooled and dust (grinding dust) generated by the grinding of the wafer 11 is washed away.

Figure 7:
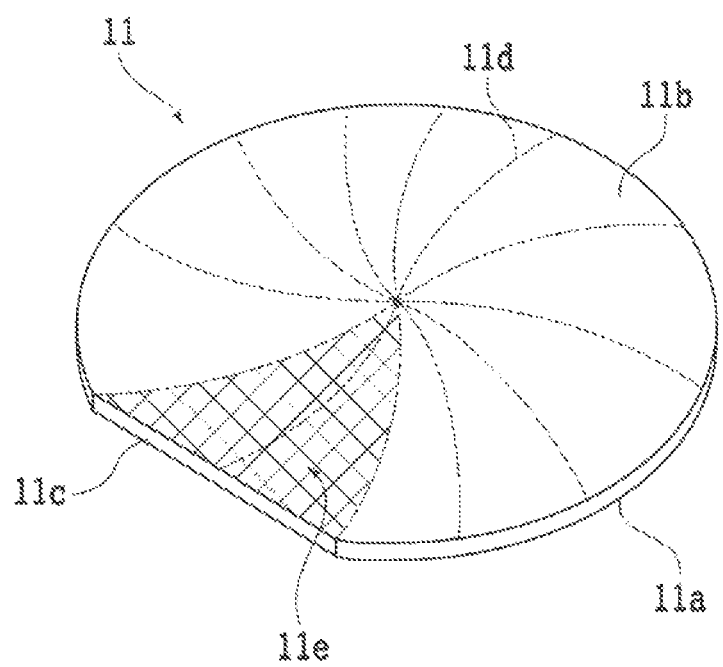
FIG. 7 is a perspective view of the wafer in the condition where the wafer grinding step has been performed.

When the thickness of the wafer 11 is reduced to a desired thickness in the wafer grinding step, the grinding of the wafer 11 is stopped. FIG. 7 is a perspective view of the wafer 11 in the condition where the wafer grinding step has been performed. When the back side 11b of the wafer 11 is ground, the saw mark 11d is radially formed on the back side 11b of the wafer 11.

As described above, in the case that the holding surface 12a of the chuck table 12 is flat, the grinding of the wafer 11 is prone to proceed in the area near the orientation flat 11c, i.e., in the near area 11e of the wafer 11. Accordingly, the near area 11e of the wafer 11 is prone to become thinner than the other areas of the wafer 11 (see FIG. 1B). To the contrary, in the wafer grinding method according to the preferred embodiment, the near area 12c of the chuck table 12 is locally ground more than the other areas of the chuck table 12 in the holding surface grinding step (see FIGS. 4A and 4B). In the next holding step, the wafer 11 is held on the holding surface 12a thus modified in shape. Accordingly, as depicted in FIG. 5B, the back side 11b of the near area 11e of the wafer 11 held on the holding surface 12a becomes lower in level than the back side 11b of the other areas of the wafer 11. As a result, in the wafer grinding step, the abrasive members 32 are less prone to come into contact with the near area 11e of the wafer 11, so that the near area 11e is less easily ground by the abrasive members 32. In other words, the easiness of grinding of the near area 11e of the wafer 11 due to the existence of the orientation flat 11c can be suppressed by the curvature of the wafer 11 due to the recessed upper surface formed in the near area 12c of the chuck table 12. That is, the near area 11e of the wafer 11 is less easily ground than the other areas of the wafer 11 due to the recessed near area 12c of the chuck table 12. As a result, an increase in grinding amount in the near area 11e of the wafer 11 as the area near the orientation flat 11c can be suppressed, so that variations in thickness of the wafer 11 ground can be reduced.

Preferably, the material of the suction holding portion 16 and the frame portion 18 forming the holding surface 12a of the chuck table 12 is the same as the material of the wafer 11. For example, in the case that the wafer 11 is a silicon wafer formed of single-crystal silicon, the suction holding portion 16 and the frame portion 18 are preferably formed of single-crystal silicon. In this case, the suction holding portion 16 and the frame portion 18 may be integrally formed, and a plurality of through holes are formed in the suction holding portion 16 so as to extend from the upper surface of the suction holding portion 16 to the lower surface thereof. In the case that the material of the suction holding portion 16 and the frame portion 18 is the same as the material of the wafer 11, the degree of easiness of grinding of the near area 11e of the wafer 11 (see FIG. 1B) becomes equal to the degree of easiness of grinding of the near area 12c of the chuck table 12 (see FIG. 4A). As a result, in the holding surface grinding step, the near area 12c of the chuck table 12 is ground to form a recessed portion having a depth offsetting the easiness of grinding of the near area 11e of the wafer 11. Accordingly, variations in thickness of the wafer 11 ground can be further reduced.

Figure 8A:
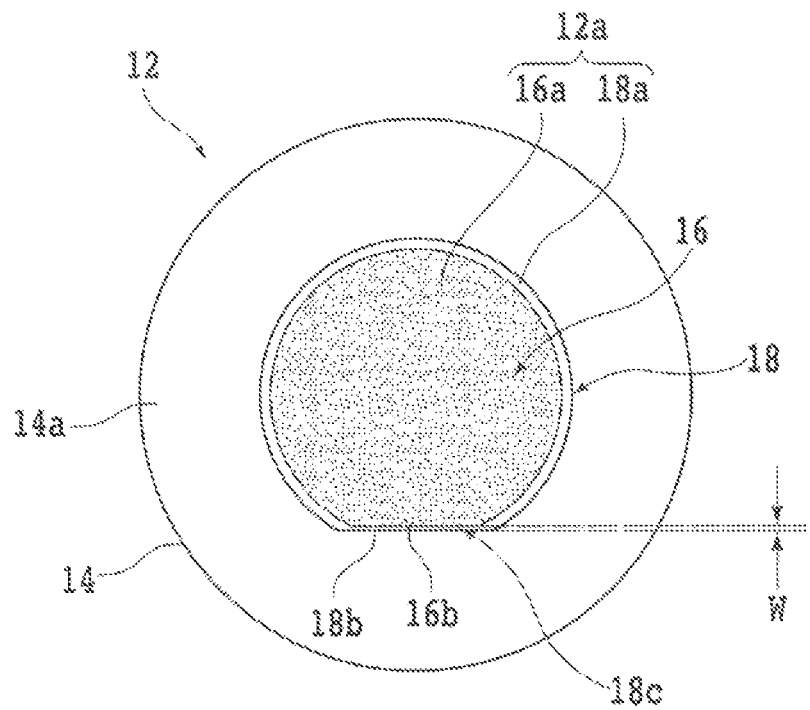
FIG. 8A is a plan view depicting the chuck table in the case that the width of a barrier portion is small.
Figure 8B:
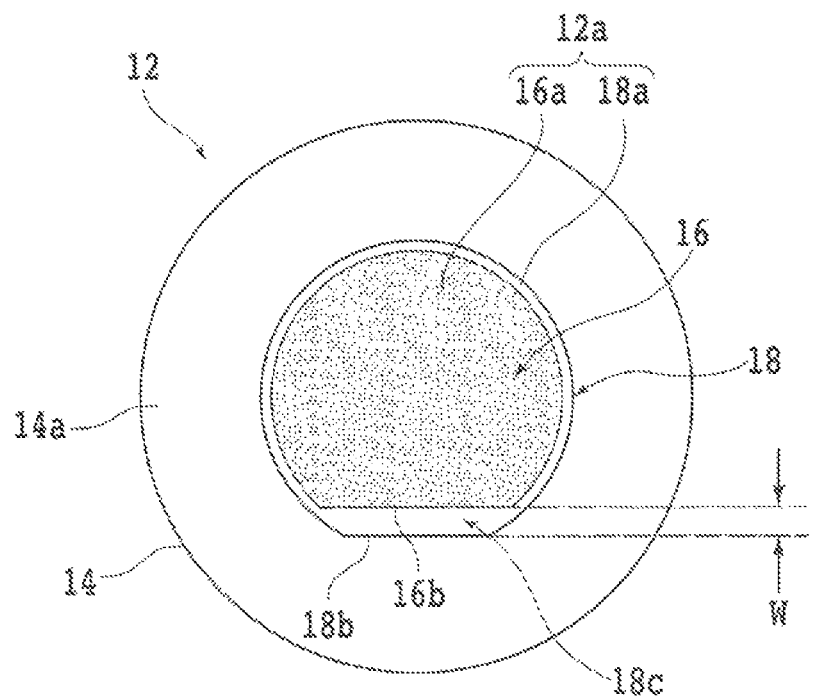
FIG. 8B is a plan view depicting the chuck table in the case that the width of the barrier portion is large.

However, the material of the suction holding portion 16 and the frame portion 18 may be different from the material of the wafer 11. In this case, there may be produced a difference between the degree of easiness of grinding of the near area 11e of the wafer 11 and the degree of easiness of grinding of the near area 12c of the chuck table 12. This difference can be reduced by adjusting the width of a part (barrier portion 18c depicted in FIG. 8A) of the frame portion 18, the part being formed along the cutout portion 16b of the suction holding portion 16. FIG. 8A is a plan view depicting the chuck table 12 in the case that a width W of the barrier portion 18c is small, and FIG. 8B is a plan view depicting the chuck table 12 in the case that the width W of the barrier portion 18c is large.

By decreasing the width W of the barrier portion 18c as depicted in FIG. 8A, the barrier portion 18c is more easily ground to be thinned in the holding surface grinding step, so that the depth of the recessed portion formed in the near area 12c of the chuck table 12 becomes large. Conversely, by increasing the width W of the barrier portion 18c as depicted in FIG. 8B, the barrier portion 18c is less easily ground to be thinned in the holding surface grinding step, so that the depth of the recessed portion formed in the near area 12c of the chuck table 12 becomes small. Thus, by adjusting the width W of the barrier portion 18c according to the materials of the wafer 11, the suction holding portion 16, and the frame portion 18, the depth of the recessed portion to be formed in the near area 12c of the chuck table 12 can be adjusted so as to correspond to the degree of easiness of grinding of the near area 11e of the wafer 11. Accordingly, even in the case that the material of the suction holding portion 16 and the frame portion 18 is different from the material of the wafer 11, variations in thickness of the wafer 11 ground can be reduced.

As described above, the wafer grinding method according to the preferred embodiment includes the holding surface grinding step of grinding the holding surface 12a of the chuck table 12 having the cutout portions 16b and 18b and the wafer grinding step of grinding the wafer 11 having the orientation flat 11c in the condition where the wafer 11 is held on the holding surface 12a ground in the holding surface grinding step. By using the wafer grinding method as mentioned above, the area 11e near the orientation flat 11c of the wafer 11 is held by the area 12c near the cutout portions 16b and 18b of the chuck table 12 where the recessed portion is formed by performing the holding surface grinding step. Accordingly, local grinding of the wafer 11 in the area 11e near the orientation flat 11c can be relaxed, so that variations in thickness of the wafer 11 ground can be reduced.

The structure, method, etc., according to the above preferred embodiment may be suitably modified without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer grinding method of grinding a wafer having an orientation flat for indicating a crystal orientation the wafer grinding method comprising:

a providing step of providing a chuck table including a holding surface, a suction holding portion and a frame portion surrounding an outer peripheral surface of the suction holding portion, the suction holding portion having a first cutout portion corresponding to the orientation flat and the frame portion having a second cutout portion formed on an outer surface of the frame portion and along the first cutout portion;

a holding surface grinding step of grinding the holding surface by using abrasive members of a grinding wheel in a condition where the chuck table and the grinding wheel are rotated, the holding surface including an upper surface of the suction holding portion and an upper surface of the frame portion;

a holding step of holding the wafer on the holding surface ground by the abrasive members in the holding surface grinding step in a condition where a position of the orientation flat coincides with positions of the first cutout portion and the second cutout portion;

a wafer grinding step of grinding the wafer by using the abrasive members in a condition where the wafer is held on the holding surface ground by the abrasive members, and wherein said holding surface grinding step further comprises forming a recessed portion in a near area of the holding surface of the chuck table, said near area being adjacent to the first cutout portion and the second cutout portion.

2. The wafer grinding method according to claim 1, wherein a material of the suction holding portion and the frame portion is the same as a material of the wafer.

3. The wafer grinding method according to claim 1, further comprising placing the suction holding portion and the frame portion on a surface of the chuck table.

* * * * *